United States Patent [19]
Alfke

[11] Patent Number: 6,134,191
[45] Date of Patent: Oct. 17, 2000

[54] OSCILLATOR FOR MEASURING ON-CHIP DELAYS

[75] Inventor: Peter H. Alfke, Los Altos Hills, Calif.

[73] Assignee: Xilinx, Inc., San Jose, Calif.

[21] Appl. No.: 09/258,509

[22] Filed: Feb. 26, 1999

[51] Int. Cl.[7] ............................. G04F 8/00; G04F 10/00; G01R 31/02; G01R 31/28; H03B 27/00
[52] U.S. Cl. ..................... 368/118; 324/73.1; 324/763; 324/765; 327/265; 331/55; 331/57; 714/733
[58] Field of Search ................... 368/110–113, 118–121; 327/265; 331/55, 57; 324/73.1, 763, 765; 714/733

[56] References Cited

U.S. PATENT DOCUMENTS

| Re. 34,363 | 8/1993 | Freeman | 307/465 |
| 4,795,964 | 1/1989 | Mahant-Shetti et al. | 324/60 |
| 5,083,299 | 1/1992 | Schwanke et al. | 568/113 |
| 5,266,890 | 11/1993 | Kumrasar et al. | 324/155 R |
| 5,625,288 | 4/1997 | Snyder et al. | 324/158 |
| 5,790,479 | 8/1998 | Conn | 368/118 |
| 5,818,350 | 10/1998 | Yeung et al. | 324/673 |

OTHER PUBLICATIONS

"Signal Delay in RC Tree Networks," IEEE Transactions on Computer–Aided Design, vol. CAD–2, No. 3, Jul. 1983, pp. 202–211.

"The Programmable Logic Data Book", 1998, available from Xilinx, Inc., 2100 Logic Drive, San Jose, California 95124, pp. 4–5 to 4–40.

*Primary Examiner*—Vit Miska
*Attorney, Agent, or Firm*—Arthur J. Behiel, Esq.; Edel M. Young

[57] ABSTRACT

A circuit separately measures one or both of the rising-edge and falling-edge signal propagation delays through a signal path of interest. The greater of these delays can then be used to establish a worst-case delay for the signal path. The worst-case delay can be used, in turn, to create accurate timing specifications for logic circuits that include similar or identical signal paths. To determine the delay through the signal path, the signal path is used with a second, typically identical, signal path to create alternating feedback paths of an oscillator. The oscillator is configured to output a test-clock signal having a period proportional to either the rising- or falling-edge delays through the two signal paths. The test-signal transitions are counted over a predetermined time period to establish the average period of the oscillator. Finally, the average period of the oscillator is related to the average signal propagation delay through the signal path of interest.

19 Claims, 4 Drawing Sheets

OSCILLATOR FOR MEASURING ON-CHIP DELAYS

FIELD OF THE INVENTION

This invention relates generally to methods and circuit configurations for measuring signal propagation delays, and in particular for measuring signal propagation delays through data paths of integrated circuits.

BACKGROUND

Integrated circuits (ICs) are cornerstones of myriad computational systems, such as personal computers and communications networks. Purchasers of such systems have come to expect significant improvements in speed performance over time. The demand for speed encourages system designers to select ICs with superior speed performance. This leads IC manufacturers to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 to output pin 140. The resulting delay is the timing parameter for the path of interest. Such parameters are typically published in literature associated with particular ICs or used to model the speed performance of circuit designs that employ the path of interest.

Conventional test procedures are problematic for at least two reasons. First, many signal paths within a given IC cannot be measured directly, leading to some speculation as to their true timing characteristics. Second, testers have tolerances that can have a significant impact on some measurements, particularly when the signal propagation time of interest is short. For example, if the tester is accurate to one nanosecond and the propagation delay of interest is measured to be one nanosecond, the actual propagation delay might be any time between zero and two nanoseconds. In such a case the IC manufacturer would have to list the timing parameter as two nanoseconds, the worst-case scenario. If listed timing parameters exceed worst-case values, some designs may fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

Programmable logic devices (PLDs) are a well-known type of digital integrated circuit that may be programmed by a user (e.g., a system designer) to perform specified logic functions. One type of PLD, the field-programmable gate array (FPGA), typically includes an array of configurable logic blocks, or CLBs, that are programmably interconnected to each other and to programmable input/output blocks (IOBs). This collection of configurable logic may be customized by loading configuration data into internal configuration memory cells that, by determining the states of various programming points, define how the CLBS, interconnections, and IOBs are configured.

Each programming point, CLB, interconnection line, and IOB introduces some delay into a signal path. The many potential combinations of these and other delay-inducing elements make timing predictions particularly difficult. FPGA designers use circuit models, called "speed files," that include delay values or resistance and capacitance values for the various delay-inducing elements that can be combined to form desired signal paths. These circuit models are then used to predict circuit timing for selected FPGA configurations.

Manufacturers of ICs, including FPGAs, would like to guarantee the fastest timing specifications possible without having any circuits fail to meet timing specifications. More accurate measurements of circuit timing allow IC manufacturers to use smaller guard bands for ensuring correct device performance, and therefore to advertise higher speed performance. There is therefore a need for a more accurate means of characterizing IC speed performance.

In U.S. Pat. No. 5,790,479, Robert O. Conn describes a ring oscillator circuit formed in an FPGA, and a counter for counting the number of oscillations that occur for a signal propagating repeatedly around the ring during a specified period of time. The oscillator allows a fast signal to propagate many times along a path and thus increases the accuracy with which the path delay can be measured. Information in U.S. Pat. No. 5,790,479 is incorporated herein by reference. However, this patent does not distinguish between the delay of a rising edge propagating along the path and the delay of a falling edge propagating along the path. Since the tightest guarantees can be made when these two delays are separately known, it is desirable to be able to measure rising and falling edge delays separately.

SUMMARY

The present invention addresses the need for an accurate means of characterizing IC speed performance. The inventive circuit is particularly useful for testing programmable logic devices, which can be programmed to include a majority of the requisite test circuitry.

In accordance with the invention, a PLD is configured to include a ring oscillator. The timing of the oscillator is defined by a pair of similar or identical test circuits, which might be any signal paths for which the associated signal propagation delays are of interest In one embodiment, for example, the test circuits are signal paths on a field-programmable gate array (FPGA). The test circuits are included as feedback paths for the oscillator so that the oscillator outputs a test-clock signal having a period proportional to the signal propagation delays of the two test circuits. The test-clock period may then be related to the average signal propagation delay through the test circuits.

The oscillator includes a two-input multiplexer having a first input terminal connected to the output of the first test circuit and a second input terminal connected to the output of the second test circuit. The multiplexer alternately selects between the outputs of the test circuits. The resulting test-clock signal on the multiplexer output terminal is an oscillating signal in which the durations of the high portions of the output signal are determined by one type of signal transition (e.g., a falling edge) through one test circuit and the durations of the low portions of the output signal are determined by the same type of signal transition (e.g., a falling edge) through the other test circuit. The period of oscillation is the sum of the delays through the two test circuits. In one embodiment, because the type of edge not being tested must propagate through one of the test circuits before that circuit is again selected for measuring the type of edge delay being tested, the two test circuits should be of similar length. In another embodiment, the two test circuits can be of significantly different lengths.

The output of the multiplexer, the test-clock signal, is connected to the multiplexer's select input and to the input terminals of both test circuits. Some embodiments of the invention measure falling-edge delays, while others measure rising-edge delays. A preferred embodiment allows a user to selectively measure either rising- or falling-edge delays. This is advantageous because signal paths often exhibit different propagation delays for falling and rising edges, due for example to imbalanced driver circuits. The worst-case delay can then be used to create accurate timing specifications for logic circuits that include signal paths similar or identical to the test circuits. Knowing precise worst-case delays allows IC designers to minimize guard bands and consequently guarantee higher speed performance.

The attached claims, and not this summary, define the scope of the present invention.

DETAILED DESCRIPTION

Figure 1:
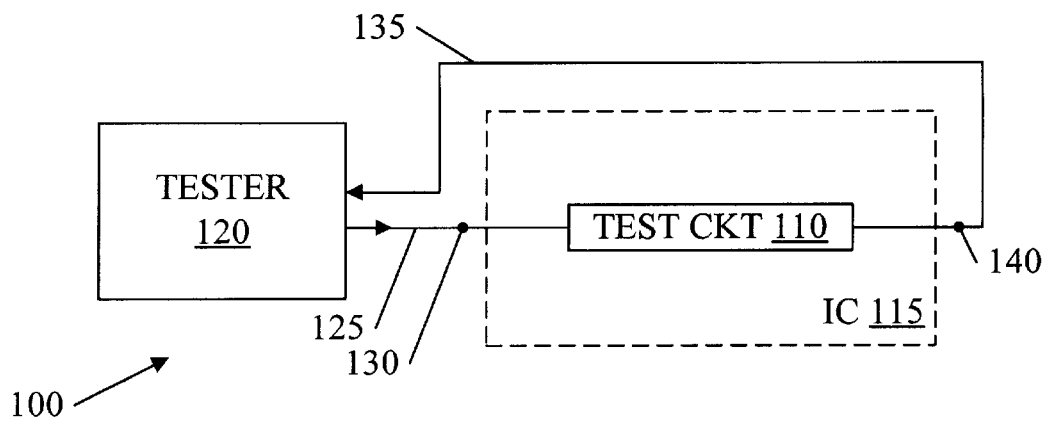
FIG. 1 depicts a conventional test configuration 100 for determining the signal propagation delay of a test circuit 110 in a conventional IC 115.
Figure 2:
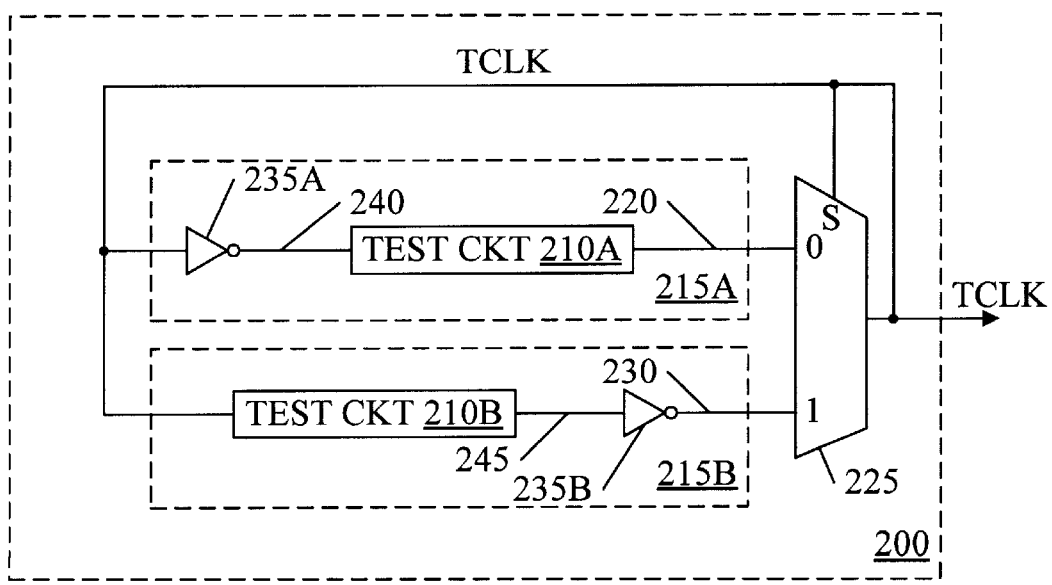
FIG. 2 is a schematic diagram of an oscillator 200 configured, in accordance with the invention, to include a pair of identical test circuits 210A and 210B.

FIG. 2 is a schematic diagram of an oscillator 200 configured, in accordance with the invention, to include a pair of similar test circuits 210A and 210B. Test circuits 210A and 210B might be any signal paths for which the associated signal propagation delays are of interest. In one embodiment, for example, test circuits 210A and 210B are signal paths on a field-programmable gate array (FPGA).

Oscillator 200 provides a test-clock signal TCLK on a like-named output terminal. The period $T_{TCLK}$ of test-clock signal TCLK is a function of the propagation delay for rising-edge signals traversing test circuits 210A and 210B. The period $T_{TCLK}$ can therefore be used to determine the rising-edge delays $D_{RA}$ and $D_{RB}$ for respective test circuits 210A and 210B. Other embodiments of the invention can be used to measure falling-edge delays, and yet other embodiments allow a user (e.g., a test engineer) to separately measure the propagation delays associated with the rising and falling edges of logic signals.

Test circuits 210A and 210B are included within a pair of respective signal paths 215A and 215B. Signal path 215A includes an output terminal 220 connected to the "0" input of a multiplexer 225; signal path 215B includes an output terminal 230 connected to the "1" input of multiplexer 225. Output terminal TCLK connects to respective input terminals of signal paths 215A and 215B and to the select input S of multiplexer 225. Also included in signal paths 215A and 215B are a respective pair of inverters 235A and 235B. Inverter 235A is connected between output terminal TCLK and an input terminal 240 of test circuit 210A. Inverter 220B is connected between an output terminal 245 of test circuit 210B and the "1" input of multiplexer 225. In the present example, test circuits 210A and 210B are assumed to be non-inverting, though the invention is not so limited.

Figure 3:
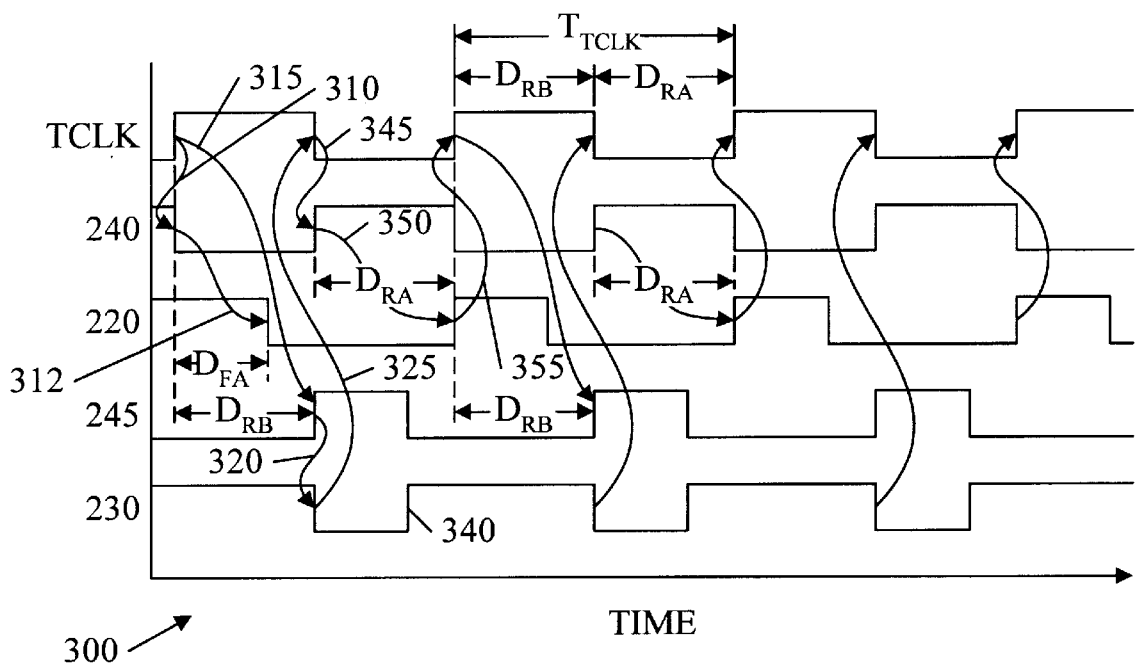
FIG. 3 is a simple waveform diagram depicting the operation of oscillator 200 of FIG. 2.

FIG. 3 is a simple waveform diagram 300 depicting the operation of oscillator 200 of FIG. 2. Each waveform in FIG. 3 is labeled using the corresponding node (e.g., terminal or line) designation depicted in FIG. 2. The node designations are hereafter used to alternatively refer to circuit nodes or their corresponding signals. In each instance, the interpretation of a node designation as either a signal or a physical element will be clear from the context.

Each rising edge on test-clock signal TCLK causes signal 240 to fall (arrow 310) after some small delay imposed by inverter 235A. Diagram 300 ignores this delay for simplicity. The falling edge on signal 240 propagates through test circuit 210A to bring signal 220 low (arrow 312) after a falling-edge signal propagation delay $D_{FA}$ imposed by test circuit 210A. Each rising edge on test-clock signal TCLK also causes signal 245 to rise (arrow 315) after a rising-edge signal propagation delay $D_{RB}$ imposed by test circuit 210B. Inverter 235B inverts the rising edge of signal 245 to produce a falling edge on terminal 230 (arrow 320). In the present example, the rising-edge delays $D_{FA}$ and $D_{RB}$ are longer than the falling-edge delays $D_{FA}$ and $D_{FB}$. The respective delays are the same for both of test circuits 210A and 210B, which are typically identical signal paths.

Recalling that test clock terminal TCLK connects to the select input of multiplexer 225, multiplexer 225 gates signal 220 (the signal on the "0" input) to test-clock terminal TCLK when test-clock signal TCLK is a logic zero. Conversely, multiplexer 225 gates signal 230 (the signal on the "1" input) to test-clock terminal TCLK when test-clock signal TCLK is a logic one. Thus, while TCLK is high, multiplexer 225 ignores signal transitions on terminal 220 and passes signal transitions on terminal 230. Consequently, test-clock signal TCLK falls from a logic one to a logic zero each time signal 230 falls from a logic one to a logic zero (arrows 325). Multiplexer 225 then ignores the subsequent rising edge 340 on signal 230 because select terminal S is at a logic zero.

Each falling edge on test-clock signal TCLK causes signal 240 to rise (arrow 345). The rising edge on signal 240 propagates through test circuit 210A to bring signal 220 high (arrow 350) after a rising-edge delay $D_{RA}$ imposed by test circuit 210A. With test-clock signal TCLK low, the rising edge on terminal 220 propagates through multiplexer 225 to bring test-clock signal TCLK back to a logic one (arrow 355). The process then continues in the above-described manner so that test-clock signal TCLK oscillates between logic one and logic zero.

Between signal transitions test-clock signal TCLK remains low for the rising-edge delay $D_{RA}$ of test circuit 210A and high for the rising-edge delay $D_{RB}$ of test circuit 210B. The period $T_{TCLK}$ of test-clock signal TCLK is therefore equal to $D_{RA}$ plus $D_{RB}$ (i.e., $T_{TCLK}=D_{RA}+D_{RB}$) Recalling that $D_{RA}$ and $D_{RB}$ are approximately equal because test circuits 210A and 210B are similar, the period $T_{TCLK}$ of test-clock signal TCLK is approximately twice $D_{RA}$ (i.e., $T_{TCLK}=2D_{RA}$). Calculating the rising-edge delay $D_{RA}$ associated with test circuit 210A (and 210B) is therefore a simple matter of measuring the test-clock signal period $T_{TCLK}$ and dividing by two. Rising-edge delay $D_{RA}$ can be saved to predict future speed performance of similar test circuits, or can be used in conjunction with other data to predict the speed performance of circuit configurations that include similar test circuits.

The foregoing analysis ignores the delays associated with inverters 235A and 235B and with multiplexer 225, which are normally short relative to the delays of test circuits 210A and 210B. More accurate models can be created by accounting for the additional delay. Methods of accounting for these delays are discussed below in connection with FIG. 8.

If test circuits 210A and 210B are identical then test-clock period $T_{TCLK}$ provides enough information to determine the delays associated with each test circuit. If test circuits 210A and 210B are not identical, then more information is needed. For example, if the delay associated with only one test circuit is known, then the known delay can be subtracted from test-clock period $T_{TCLK}$ to determine the unknown delay. The ratio of the respective loads associated with the test circuits might also be used with test-clock period $T_{TCLK}$ to determine the respective delays. Finally, if neither the individual delays nor the delay ratio are known, the individual delays can be calculated using the period and duty cycle of test clock TCLK.

U.S. patent application Ser. No. 09/115,138, entitled "Method and System for Measuring Signal Propagation Delays Using the Duty Cycle of a Ring Oscillator," by Christopher H. Kingsley, et al., filed Jul. 14, 1998, teaches some methods for measuring the duty cycle of a test clock, and is incorporated herein by reference. Other incorporated references of interest are:

1. U.S. patent application Ser. No. 09/083,892, entitled "Method For Characterizing Interconnect Timing Characteristics," by Robert O. Conn, filed May 21, 1998 [docket no. X-252-1C];
2. U.S. patent application Ser. No. 09/115,204, entitled "Built-In Self Test Method For Measuring Clock To Out Delays," by Robert W. Wells and Robert D. Patrie, filed Jul. 14, 1998 [docket no. X-252-4P];
3. U.S. patent application Ser. No. 09/114,369, entitled "Method and System for Measuring Signal Propagation Delays Using Ring Oscillators," by Robert D. Patrie, et al., filed Jul. 14, 1998 [docket no. X-252-3P].

The frequency of oscillator 200 provides a very accurate measure of the delay of test circuit 210A because the delay is measured over many cycles and because the delays associated with rising and falling edges are measured separately. Moreover, the method is inexpensive to implement in FPGAs because FPGAs can be configured to simultaneously include many test circuits and the test circuitry (e.g., multiplexer 225) required to characterize the test circuits.

Figure 4:
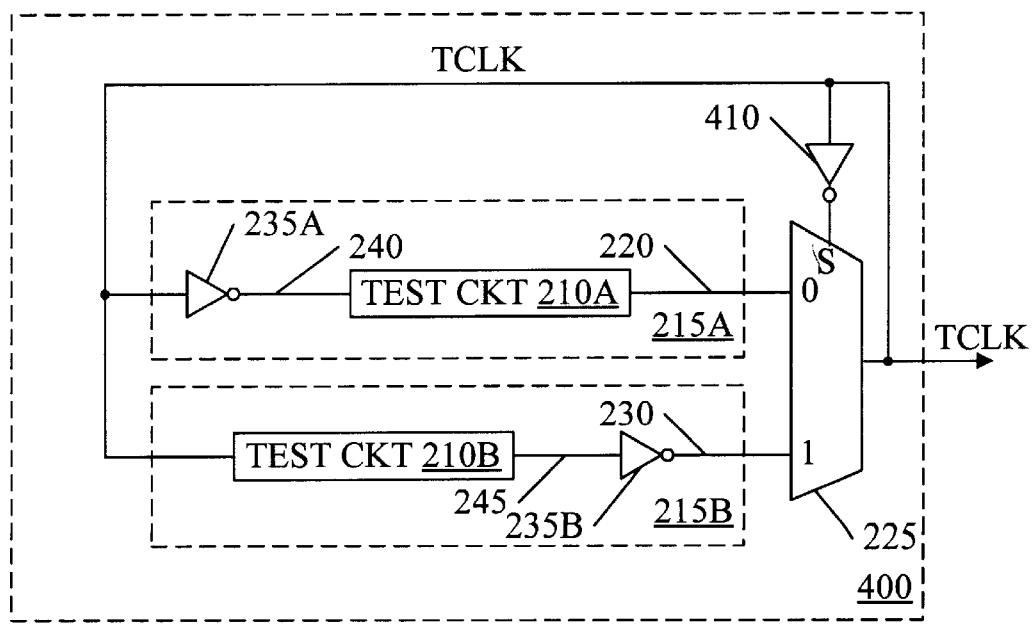
FIG. 4 is a schematic diagram of an oscillator 400 configured, in accordance with the invention, to produce a test-clock signal TCLK having a period $T_{TCLK}$ proportional to the falling-edge delays $D_{FA}$ and $D_{FB}$ of test circuits 210A and 210B.

FIG. 4 is a schematic diagram of an oscillator 400 configured, in accordance with the invention, to produce a test-clock signal TCLK for which the period $T_{TCLK}$ is proportional to the falling-edge delays $D_{FA}$ and $D_{FB}$ for test circuits 210A and 210B. Oscillator 400 is similar to oscillator 200 of FIG. 2, like-numbered elements being the same. Oscillator 400 differs from oscillator 200 however in that oscillator 400 includes an inverter 410 connected between test-clock terminal TCLK and the select input S of multiplexer 225. The operation of oscillator 400 is similar to that of oscillator 200, except that multiplexer 225 selects terminal 220 when test-clock signal TCLK is a logic one and selects terminal 230 when test-clock signal TCLK is a logic zero. As a result, the period $T_{TCLK}$ is the sum of the respective falling- edge delays $D_{FA}$ and $D_{FB}$ for test circuits 210A and 210B. A detailed discussion of oscillator 400 is omitted for brevity.

Oscillators 200 and 400 provide accurate measures of signal propagation delay when the delay being measured is the longer of the rising- and falling-edge delays $D_R$ and $D_F$. Oscillators 200 and 400 can be used to measure the shorter of the rising- and falling-edge delays $D_R$ and $D_F$ by modifying test circuits 210A and 210B to ensure that the type of delay being measured (e.g., rising-edge delay $D_R$) is longer than the other type of delay (e.g., falling-edge delay $D_F$). Some such modifications are discussed below in connection with FIGS. 5 and 6.

Figure 5:
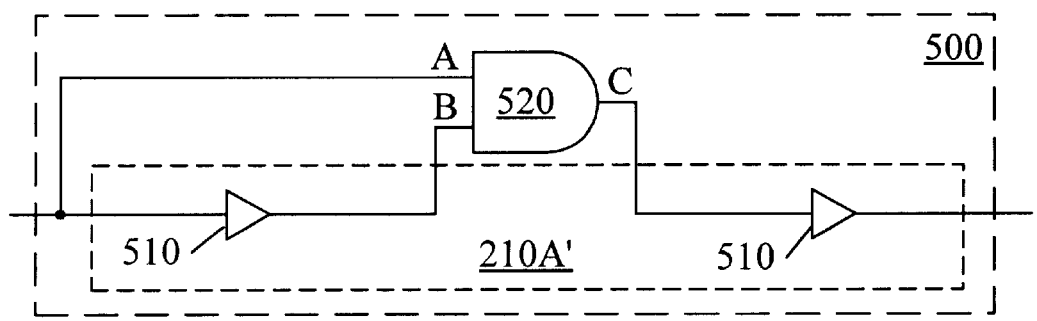
FIG. 5 schematically depicts a test circuit 500 that includes test circuit 210A of FIG. 2.

FIG. 5 schematically depicts a test circuit 500 that includes test circuit 210A' similar to test circuit 210A of FIG. 2. Test circuit 210A' includes a number of buffers 510 that merely represent delay-inducing elements, the combined effects of which are of interest. An AND gate 520 inserted into the signal path of test circuit 210A' reduces the signal propagation delay of falling edges traversing test circuit 210A'. Replacing test circuits 210A and 210B of FIG. 2 with a pair of test circuits 500 thus ensures that rising-edge delay $D_R$ is longer than falling-edge delay $D_F$. Accounting for the delay induced by AND gate 520 provides a more accurate delay measurement.

While AND gate 520 is depicted in the electrical center of test circuit 500, this need not be the case. Input A to AND gate 520 should bypass enough of the relevant test circuitry to ensure that the falling-edge delay $D_F$ is shorter than the rising-edge delay $D_R$. Further, test circuits that are not easily bisected can nevertheless be tested in accordance with the invention. For example, the test circuit of interest could be implemented before and after AND gate 520. The resulting test-clock period $T_{TCLK}$ would be twice as long as in the depicted embodiment.

Figure 6:
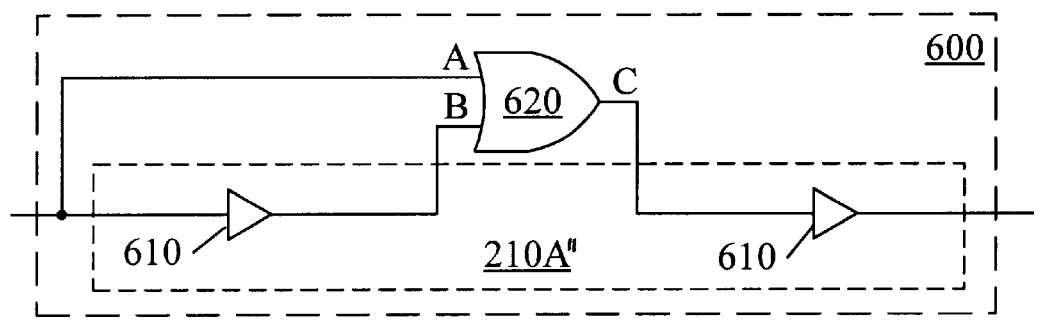
FIG. 6 schematically depicts a test circuit 600 that includes test circuit 210A of FIG. 4.

FIG. 6 schematically depicts a test circuit 600 that includes test circuit 210A" similar to test circuits 210A and 210B of FIG. 4. Test circuit 600 includes a number of buffers 610 that represent delay-inducing elements. An OR gate 620 inserted into the signal path of test circuit 210A reduces the signal propagation delay for rising edges through test circuit 210A. Replacing test circuits 210A and 210B of FIG. 4 with a pair of test circuits 600 thus ensures that falling-edge delay $D_R$ is longer than rising-edge delay $D_R$. Accounting for the delay of OR gate 610 provides a more accurate delay measurement. As with AND gate 520, OR gate 620 need not bisect test circuit 210A.

Figure 7:
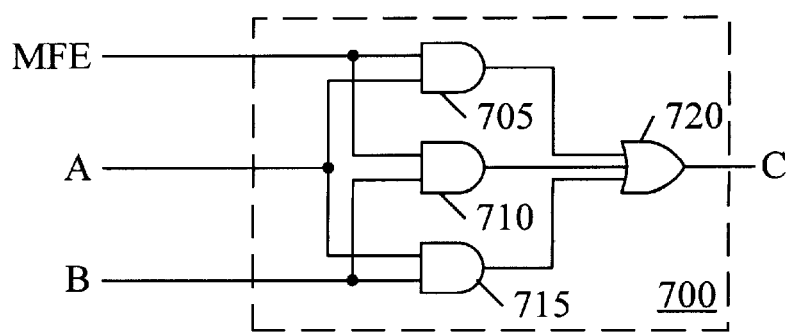
FIG. 7 schematically depicts a logic circuit 700 that may be used in place of gates 520 and 620 of FIGS. 6 and 7, respectively.

FIG. 7 schematically depicts a logic circuit 700 that may be used in place of gates 520 and 620 of FIGS. 6 and 7, respectively. Circuit 700 includes a trio of AND gates 705, 710, and 715 and an OR gate 720. Input terminals A and B and output terminal C correspond to like-designated terminals of FIGS. 5 and 6. A third input MFE, which stands for "measure falling edge," controls whether circuit 700 provides an AND function of A and B or an OR function of A and B. When signal MFE is a logic one, circuit 700 functions as an OR gate; conversely, when signal MFE is a logic zero, circuit 700 functions as an AND gate.

Figure 8:
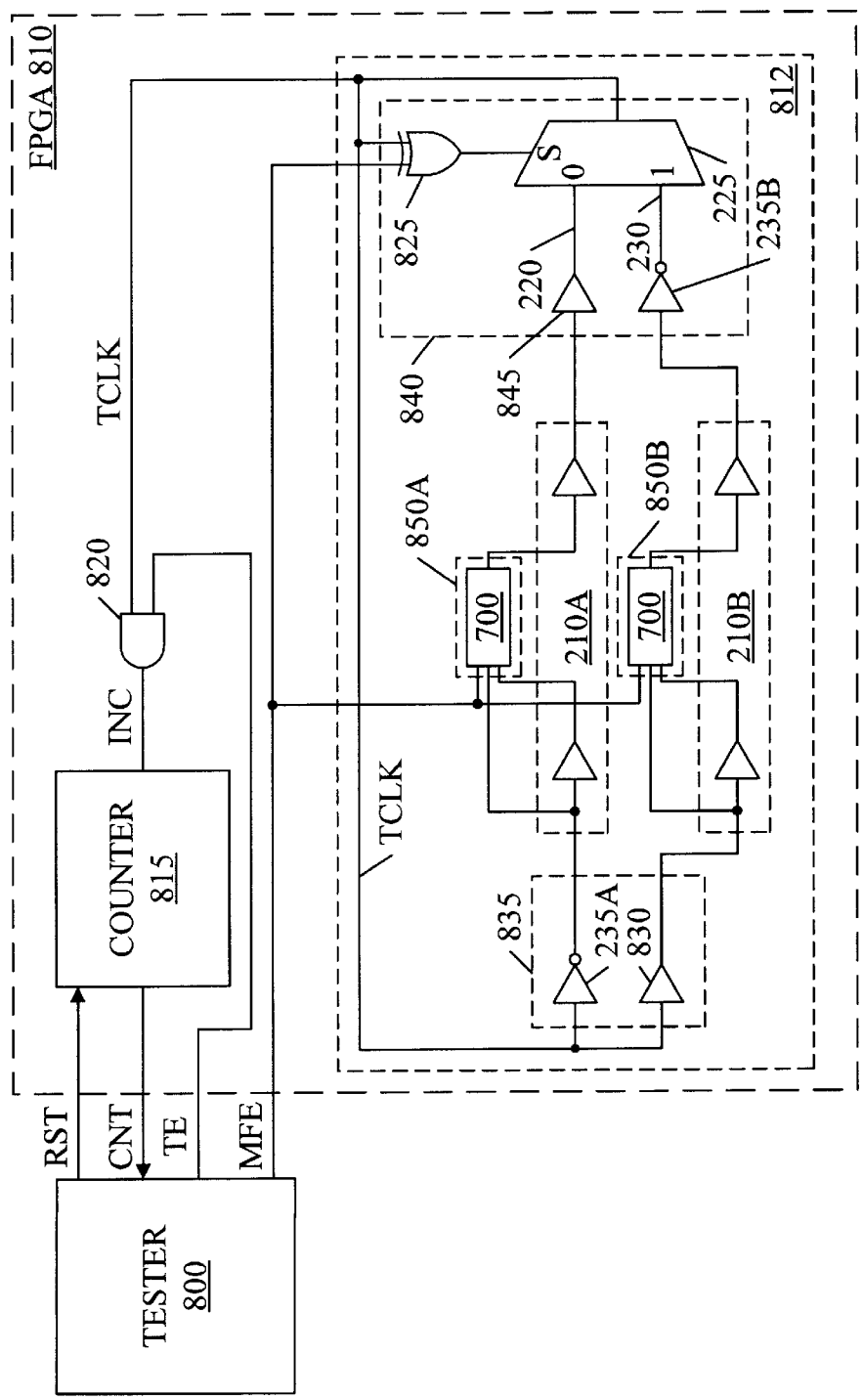
FIG. 8 is a schematic diagram of a conventional tester 800 connected to an FPGA 810 configured in accordance with the present invention.

FIG. 8 is a schematic diagram of a conventional tester 800 connected to a conventional FPGA 810 configured in accordance with the present invention. FPGA 810 is configured to include an oscillator 812 similar to oscillators 200 and 400 of FIGS. 2 and 4, respectively, like-number elements being the same. As described below in detail, the depicted configuration selectively measures signal propagation delays for both rising and falling edges traversing test circuits 210A and 210B.

Test-clock signal TCLK connects to a test counter 815 via an AND gate 820. Test counter 815 is a conventional binary counter adapted to count the number of rising edges on increment line INC. Test counter 815 is connected via a test-count line CNT and a reset line RST to tester 800. Reset line RST allows tester 800 to reset test counter 815 to zero.

Tester 800 provides a test-enable signal TE to an input terminal of AND gate 820 and a measure-falling-edges signal MFE to one input terminal of an XOR gate 825 and to each of two circuits 700. As discussed above in connection with FIG. 7, applying signal MFE to circuits 700 reduces the delay associated with either rising or falling edges through test circuits 210A and 210B. Signal MFE is additionally used in oscillator 812 to control the operation of XOR gate 825. The presence of a logic one on line MFE causes XOR gate 825 to function as an inverter, whereas a logic zero on line MFE causes XOR gate 825 to function as a buffer. For this reason, XOR gates 825 may be though of as a "selective inverter." When configured as a buffer, oscillator 812 works like oscillator 200 of FIG. 2 to provide a test-clock signal TCLK that may be used to measure rising-edge delays $D_R$ associated with test circuits 210A and 210B; when configured as an inverter, oscillator 812 works like oscillator 400 of FIG. 4 to provide a test-clock signal TCLK that may be used to measure falling-edge delays $D_F$ associated with test circuits 210A and 210B.

By providing the appropriate Logic level on line MFE, tester 800 determines whether the signal propagation delay being measured is for rising or falling edges. If the falling-edge delays $D_F$ through test circuits 210A and 210B are of interest, the line MFE is asserted (i.e., set to logic one). Circuits 700 then reduce the rising-edge delays through test circuits 210A and 210B as described above in connection with FIG. 7. Oscillator 812 then outputs a test-clock signal TCLK that has a period $T_{TCLK}$ proportional to the falling-edge delay $D_F$ through test circuits 210A and 210B. If the rising- edge delays $D_R$ through test circuits 210A and 210B are of interest, the line MFE is released (i.e., set to logic zero). Circuits 700 then reduce the falling-edge delays through test circuits 210A and 210B. The period $T_{TCLK}$ of test-clock signal TCLK is then proportional to the rising-edge delay $D_R$ through test circuits 210A and 210B.

Regardless of the type of delay being measured, counter 815 counts the number of test-clock transitions over a test period $T_{TEST}$ defined by the duration of test-enable signal TE. Tester 800 then reads the resulting count via bus CNT and calculates the signal propagation delay through test circuits 210A and 210B by dividing the test period $T_{TEST}$ by twice the count.

Oscillator 800 is implemented using programmable logic available on FPGA 810. Inverter 235A is implemented, along with a buffer 830, in a function generator 835. A second function generator 840 provides the functionality of inverter 135B, multiplexer 225, XOR gate 825, and a buffer 845. Circuits 700 are likewise implemented in a pair of function generators 850A and 850B.

In one embodiment, each of function generators 835, 840, 850A, and 850B comprises a look-up table. These look-up tables are standard FPGA components capable of implementing any arbitrarily defined Boolean function of up to four inputs. The propagation delays through the function generators are independent of the functions implemented. Thus, each of function generators 835, 840, 850A and 850B introduces the same signal propagation delay. These delays are well characterized, so the combined effects of the function generators may easily be subtracted from test-clock period $T_{TCLK}$ for improved accuracy.

While the present invention has been described in connection with specific embodiments, variations of these embodiments will be obvious to those of ordinary skill in the art. Therefore, the spirit and scope of the appended claims should not be limited to the foregoing description.

What is claimed is:

1. An oscillator comprising:
   a. a multiplexer having first and second multiplexer input terminals, a select terminal, and a multiplexer output terminal connected to the select terminal;
   b. a first signal path having:
      i. an inverter having:
         (1) an inverter input terminal connected to the multiplexer output terminal; and
         (2) an inverter output terminal; and
      ii. a test circuit having:
         (1) a test-circuit input terminal connected to the inverter output terminal; and
         (2) a test-circuit output terminal connected to the first multiplexer input terminal;
            wherein the test circuit delays high-to-low signal transitions by a first delay period and delays low-to-high signal transitions by a second delay period; and
   c. a second signal path having a second input terminal connected to the multiplexer output terminal and a second output terminal connected to the second multiplexer input terminal.

2. The oscillator of claim 1, wherein the test circuit is non-inverting.

3. The oscillator of claim 1, wherein the second signal path further comprises an inverter.

4. The oscillator of claim 3, wherein the first delay period is different from the second-delay period and the second signal path comprises a second test circuit adapted to receive signal transitions, wherein the second test circuit delays high-to-low signal transitions by a third delay period and delays low-to-high signal transitions by a fourth delay period different from the third delay period.

5. The oscillator of claim 4, wherein the third delay period is approximately equal to the first delay period.

6. The oscillator of claim 1, wherein the second signal path further comprises a second inverter connected between the second output node and the second multiplexer input terminal.

7. The oscillator of claim 1, further comprising a second inverter having an inverter input terminal connected to the multiplexer output terminal and an inverter output terminal connected to the select terminal.

8. The oscillator of claim 2, wherein the test circuit comprises a signal path on a programmable logic device.

9. The oscillator of claim 8, wherein the first-mentioned test circuit and the second, test circuit are signal paths on a programmable logic device.

10. The oscillator of claim 2, wherein the test circuit comprises a logic element adapted to decrease one of the first and second delay periods.

11. A system comprising:
   a. a test oscillator configured to produce a test clock comprised of alternating falling and rising signal transitions on a test-clock output terminal, the test oscillator including:
      i. a multiplexer having first and second multiplexer input terminals, a select terminal, and a multiplexer output terminal connected to the select terminal and to the test-clock output terminal;

ii. a first signal path having a first input terminal connected to the multiplexer output terminal and a first output terminal connected to the first multiplexer input terminal; and iii. a second signal path having a second input terminal connected to the multiplexer output terminal and a second output terminal connected to the second multiplexer input terminal; and b. a counter having a counter input terminal connected to the test-clock output terminal.

12. The system of claim 11, wherein the first signal path comprises a test circuit adapted to receive signal transitions on a test-circuit input node and to output corresponding signal transitions on a test-circuit output node, wherein the test circuit delays the high-to-low signal transitions by a first delay period and delays the low-to-high signal transitions by a second delay period different from the first delay period.

13. The system of claim 12, wherein the first signal path further comprises an inverter.

14. The system of claim 12, wherein the second signal path comprises a second test circuit adopted to receive signal transitions on a second test-circuit input node and to output corresponding signal transitions on a second test-circuit output node, wherein the second test circuit delays the high-to-low signal transitions by a third delay period and delays the low-to-high signal transitions by a fourth delay period different from the third delay period.

15. The system of claim 14, wherein the first signal path further comprises an inverter.

16. The system of claim 11, further comprising a selective inverter having a inverter input terminal connected to the multiplexer output terminal and an inverter output terminal connected to the select terminal.

17. The oscillator of claim 12, wherein the test circuit comprises a signal path on a programmable logic device.

18. The oscillator of claim 17, wherein the first-mentioned test circuit and the second test circuit are signal paths on a programmable logic device.

19. The oscillator of claim 12, wherein the test circuit comprises a logic element adapted to decrease one of the first and second delay periods.

* * * * *